(12) United States Patent
Wang

(10) Patent No.: US 12,093,081 B2
(45) Date of Patent: Sep. 17, 2024

(54) FLEXIBLE DISPLAY MODULE

(71) Applicant: Wuhan China Star Optoelectronics Semiconductor Display Technology Co., Ltd., Hubei (CN)

(72) Inventor: Wenqiang Wang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/600,104

(22) PCT Filed: Jul. 13, 2021

(86) PCT No.: PCT/CN2021/105909
§ 371 (c)(1),
(2) Date: Sep. 30, 2021

(87) PCT Pub. No.: WO2022/262034
PCT Pub. Date: Dec. 22, 2022

(65) Prior Publication Data
US 2024/0045471 A1     Feb. 8, 2024

(30) Foreign Application Priority Data

Jun. 15, 2021   (CN) .......................... 202110661014.8

(51) Int. Cl.
| | |
|---|---|
| *G06F 1/16* | (2006.01) |
| *H10K 59/80* | (2023.01) |
| *H10K 77/10* | (2023.01) |
| *H10K 102/00* | (2023.01) |

(52) U.S. Cl.
CPC ....... *G06F 1/1652* (2013.01); *H10K 59/8722* (2023.02); *H10K 77/111* (2023.02); *H10K 2102/311* (2023.02)

(58) Field of Classification Search
CPC .............. G06F 1/1652; H10K 59/8722; H10K 77/111; H10K 2102/311
See application file for complete search history.

(56) References Cited

U.S. PATENT DOCUMENTS

2017/0294495 A1 * 10/2017 Shyu ....................... H10K 59/35
2019/0036068 A1 *  1/2019 Kim ....................... G06F 1/1601

FOREIGN PATENT DOCUMENTS

| CN | 110211497 A | * | 9/2019 | ............. G09F 9/301 |
|---|---|---|---|---|
| CN | 110827693 | | 2/2020 | |
| CN | 110853520 | | 2/2020 | |
| CN | 111862824 A | * | 10/2020 | ........... G06F 1/1616 |
| CN | 211742521 | | 10/2020 | |
| CN | 112002230 | | 11/2020 | |

(Continued)

*Primary Examiner* — Rockshana D Chowdhury
*Assistant Examiner* — Keon Kim

(57) ABSTRACT

The present disclosure provides a flexible display module including a flexible display panel and a support element. The support element includes a glue layer, and a first support plate and a second support plate respectively disposed on two opposite sides of the glue layer. The first support plate includes a first flexible part disposed in the flexible area, and the first flexible part includes a plurality of first through holes. The second support plate includes a plurality of second flexible parts disposed in the flexible area, and the second flexible part includes a plurality of blind holes.

18 Claims, 8 Drawing Sheets

(56) References Cited

FOREIGN PATENT DOCUMENTS

| | | | | |
|---|---|---|---|---|
| CN | 211928943 | | 11/2020 | |
| CN | 211928943 U | * | 11/2020 | ........... G06F 1/1601 |
| CN | 112150926 | | 12/2020 | |
| CN | 112786621 | | 5/2021 | |
| CN | 112863362 A | * | 5/2021 | ............. G09F 9/301 |
| WO | WO 2020/138540 | | 7/2020 | |

* cited by examiner

FLEXIBLE DISPLAY MODULE

RELATED APPLICATIONS

This application is a National Phase of PCT Patent Application No. PCT/CN2021/105909 having International filing date of Jul. 13, 2021, which claims the benefit of priority of Chinese Patent Application No. 202110661014.8 filed on Jun. 15, 2021. The contents of the above applications are all incorporated by reference as if fully set forth herein in their entirety.

FIELD AND BACKGROUND OF THE INVENTION

The present application relates to a field of display technology and particularly to a flexible display module.

Organic light-emitting diode (OLED) display technology has been widely used in a mobile phone industry, and an application of small and medium sized OLED panels in folding mobile phones has entered a commercialization stage. However, a crease problem of the folding mobile phones has not been effectively solved. For this reason, industry researchers have been working hard to find new solutions to make up for technical shortcomings of the folding mobile phones that cannot solve the crease problem of OLED screens in a short term. In order to realize contraction and expansion of a mobile phone screen from small to large as a same display effect as the folding mobile phone, and minimize the problem of the creases, OLED technology of a scrolling screen has been created.

However, many problems in a manufacturing process, a module design, and optics still exist regarding a scrolling OLED screen. Wherein, the scrolling screen must withstand a stretching and curling stress of a reel folding and unfolding action during use. Therefore, a screen is required to be well adapted to this stress environment to avoid debonding of glue layers and film layers inside a module. At the same time, the screen is also required to have a good flatness when unfolded.

In an OLED display module stacking structure, in order to ensure a good overall flatness of the module, a bottom layer of the stacking structure is generally made of a thin steel use stainless (SUS) plate as a module support layer. In order to ensure that the OLED screen has a good bendable and rollable performance, a thickness of the SUS has a strict size limit. The thickness of the SUS used in a flexible OLED screen module ranges from 30 um to 150 um, and is directly related to a bending radius of the screen. Generally, the smaller a radius is, the smaller the thickness of the SUS is selected, but recovery of flatness of the screen is poor after unfolding. In order to take into account bendability and flatness of the screen, a usual method is to dispose the thickness of the SUS in a range from 100 um to 150 um, and pattern the SUS in a curled area. A method of removing continuity of a material in a thickness direction of the SUS is configured to reduce an elastic modulus in a bending direction and improve the bendability. However, the method still fails to effectively solve a problem of poor recovery of the flatness of the screen after curling and unfolding.

SUMMARY OF THE INVENTION

An embodiment of the present disclosure provides a flexible display module to solve a technical problem that an existing rollable display module has a poor flatness recovery from a rolled state to an unfolded state.

The present disclosure provides a flexible display module, including a flexible area, and the flexible display module includes a flexible display panel and a support element for supporting the flexible display panel, wherein the support element includes:

a glue layer; and a first support plate and a second support plate respectively disposed on two opposite sides of the glue layer;

wherein the first support plate includes a first flexible part disposed in the flexible area, and the first flexible part includes a plurality of first through holes; and wherein the second support plate includes a plurality of second flexible parts disposed in the flexible area, and a side of the second flexible part away from the first support plate includes a plurality of blind holes.

In some embodiments of the present disclosure, the plurality of first through holes are disposed along a first direction and a second direction intersecting the first direction, and the plurality of blind holes are disposed along the first direction, and a plane on which the first direction and the second direction are disposed is parallel to a surface of the support element, and the second direction is parallel to a reel or a bending axis.

In some embodiments of the present disclosure, the second direction is a column direction, and a center line of any column of the plurality of blind holes along the second direction is aligned with a center line of one of columns of the plurality of first through holes along the second direction in a thickness direction of the glue layer.

In some embodiments of the present disclosure, a distance between center lines of two adjacent columns of the plurality of blind holes along the second direction is twice a distance between center lines of two adjacent columns of the plurality of first through holes along the second direction.

In some embodiments of the present disclosure, the first support plate includes a first edge and a second edge perpendicular to the second direction and opposite to each other, and the first flexible part includes a plurality of second holes disposed along the first edge and the second edge, and any one of the plurality of second through holes intersects a corresponding edge.

In some embodiments of the present disclosure, the second direction is a column direction, and any one of the plurality of second through holes is in a same column as at least one of the plurality of first through holes, and the plurality of second through holes disposed along the first edge or the second edge are disposed at intervals of one column of the plurality of first through holes.

In some embodiments of the present disclosure, a center line of any one of the plurality of blind holes along the second direction and a center line of at least one of the plurality of second through holes along the second direction coincide in a thickness direction of the glue layer.

In some embodiments of the present disclosure, a bending inner radius of the support element is R, and a maximum thickness of the first support plate is $H_1$, and a thickness of the glue layer is $H_2$, and a maximum thickness of the second support is $H_3$, and a width of the blind hole along the first direction is $B_1$, and a distance between two adjacent blind holes disposed along the first direction is $B_2$, and a width of each of the plurality of second through holes along the first direction is $C_1$, and a distance between two adjacent second through holes disposed along the first edge or the second edge is $C_2$, wherein the support element satisfies a following relationship:

$$\frac{C_1}{B_1} = \frac{C_2}{B_2} = \frac{R + H_1 + H_2 + 0.5H_3}{R + 0.5H_1}.$$

In some embodiments of the present disclosure, a maximum thickness of the second support plate is $H_3$, and a depth of each of the plurality of the blind hole is $H_4$, and a value range of a ratio of the $H_4$ to the $H_3$ is between 0.4 and 0.5.

In some embodiments of the present disclosure, the second support plate includes a third edge disposed on a same side as the first edge, and a fourth edge disposed on a same side as the second edge, and any one of the plurality of blind holes penetrates the third edge and the fourth edge along the second direction.

In some embodiments of the present disclosure, a shape of each of the plurality of second through holes is U-shaped.

In some embodiments of the present disclosure, the first direction is perpendicular to the second direction, and the support element includes a symmetry axis parallel to the first direction, and the support element is symmetrical about the symmetry axis.

In some embodiments of the present disclosure, the first support plate further includes a plurality of third through holes disposed along the first direction and the second direction, and the plurality of third through holes and the plurality of first through holes are alternately disposed in the second direction.

In some embodiments of the present disclosure, the second direction is a column direction, and a center line of any column of the plurality of third through holes along the second direction coincides in a center line of the first through holes in a same column.

In some embodiments of the present disclosure, a distance between adjacent third through hole and the first through hole in a same column is half of a maximum width of the first though hole along the first direction.

In some embodiments of the present disclosure, the second direction is a column direction, and two adjacent columns of the plurality of first through holes are disposed in a staggered manner.

In some embodiments of the present disclosure, the second direction is a column direction, and a distance between two adjacent columns of the plurality of first through holes is equal to a maximum width of the plurality of first though holes along the first direction.

In some embodiments of the present disclosure, a ratio of a maximum length of the plurality of the first through holes in the second direction and a maximum width of the plurality of first through holes in the first direction ranges from 40 to 60.

In some embodiments of the present disclosure, the flexible display module further includes:
a backplane disposed between the flexible display panel and the support element;
a polarizer disposed on a side of the flexible display panel away from the support element; and
a cover plate disposed on a side of the polarizer away from the flexible display panel.

In some embodiments of the present disclosure, the flexible display panel is disposed on a side close to the first support plate of the support element.

The flexible display module provided by the present disclosure has characteristics of a good bending performance, a good extensibility, and a high reliability, and can improve a flatness of the flexible display module from a curled or bent state to a flat state, and reduce a risk of separating inner film layers of the flexible display module.

BRIEF DESCRIPTION OF THE SEVERAL VIEW OF THE DRAWINGS

DESCRIPTION OF SPECIFIC EMBODIMENTS OF THE INVENTION

The present disclosure provides a flexible display module. In order to make purposes, technical solutions, and effects of the disclosure clearer, the present disclosure will be further described in detail with reference to accompanying drawings and examples. It should be understood that specific embodiments described here are only used to explain the present disclosure, and are not used to limit the present disclosure.

A prior art generally adopts a patterned design on a part of a support plate disposed in a bending area or a curling area, so as to reduce an elastic modulus in bending and curling directions and improve bendability. But this method still fails to effectively solve a problem of a poor recovery of a flatness of a screen after curling and unfolding. An embodiment of the present disclosure provides a flexible display module to solve above-mentioned defects.

Figure 1:
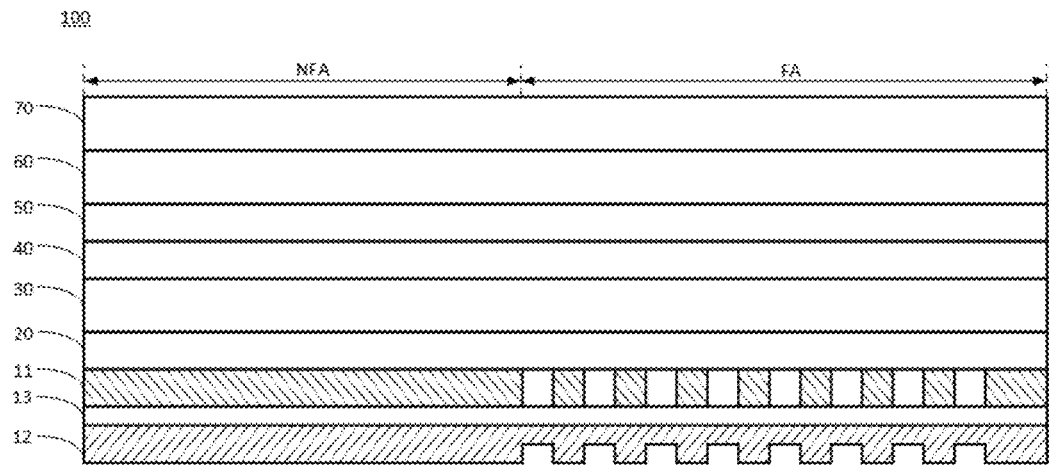
FIG. 1 is a schematic diagram of a film layer stacking structure of a flexible display module according to an embodiment of the present disclosure.
Figure 2:
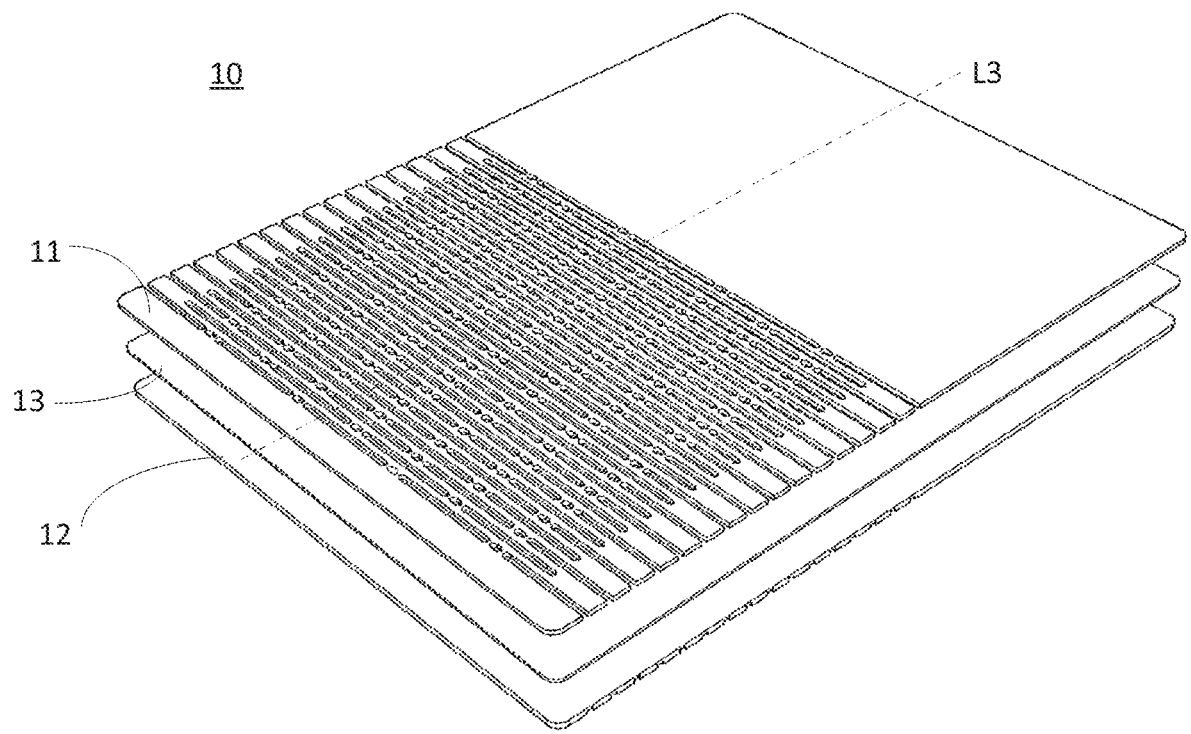
FIG. 2 is an exploded structure schematic diagram of a support element according to an embodiment of the present disclosure.

Please refer to FIG. 1 and FIG. 2, an embodiment of the present disclosure provides a flexible display module 100 including a flexible area FA. The flexible display module 100 includes a flexible display panel 40 and a support element 10 for supporting the flexible display panel 40.

Wherein, the flexible area FA can be deformed under an action of an external force, and a deformation can be at least one of bending, folding, winding, and twisting. The embodiment of the present disclosure does not limit a number and a deformation mode of the flexible area FA. The flexible display module 100 can specifically be a curled display module, which can be rolled up or unfolded around a reel. The flexible display module 100 can also be a folded display module, which can be bent along at least one bending axis. The flexible display module 100 can also have a bending performance and a winding performance at the same time.

In addition, the flexible display module 100 further includes an inflexible area NFA disposed on one side of the flexible area FA, and the inflexible area NFA does not deform under the action of the external force.

Please refer to FIG. 1 to FIG. 4. The support element 10 includes a glue layer 13, and a first support plate 11 and a second support plate 12 respectively disposed on two opposite sides of the glue layer 13. Wherein the first support plate 11 includes a first flexible part 1101, and the first flexible part 1101 includes a plurality of first through holes 111. The second support plate 12 includes a second flexible part 1201. A side of the second flexible part 1201 away from the first support plate 11 includes a plurality of blind holes 121. The first flexible part 1101 and the second flexible part 1201 are both disposed in the flexible area FA, that is, the plurality of first through holes and the plurality of blind holes 121 are both disposed in the flexible area FA. The first support plate 11 and the second support plate 12 are bonded through the glue layer 13. A viscous damping effect and low modulus characteristics of the glue layer 13 are configured to buffer and release a bending and crimping stress of upper and lower support plates.

The support element 10 provided by an embodiment of the present disclosure can satisfy a bending and curling performance of the flexible display module 100. Optimization of a thicknesses of the first support plate 11 and the second support plate 12 through a simulation can not only provide enough support for the flexible display panel, but also improve the flatness of the flexible display module when the flexible display module returns to a flat state after bending or curling.

The prior art generally improves a flatness of a rollable display module in an unfolded state by simply increasing a thickness of the support plate. However, this solution will not only cause an excessive stress on the support plate itself and make an entire rollable display module uneasy to bend, but also cause a fracture behavior and a risk of film separation. The support element 10 of the flexible display module 100 provided in the embodiment is a composite structure, and the first support plate 11 and the second support plate 12 have different patterning designs, which can not only improve an overall support stiffness of the flexible display module in the unfolded state to improve the flatness, but also reduce the elastic modulus of the flexible area FA of the flexible display module and improve the bending and curling performance.

Figure 3:
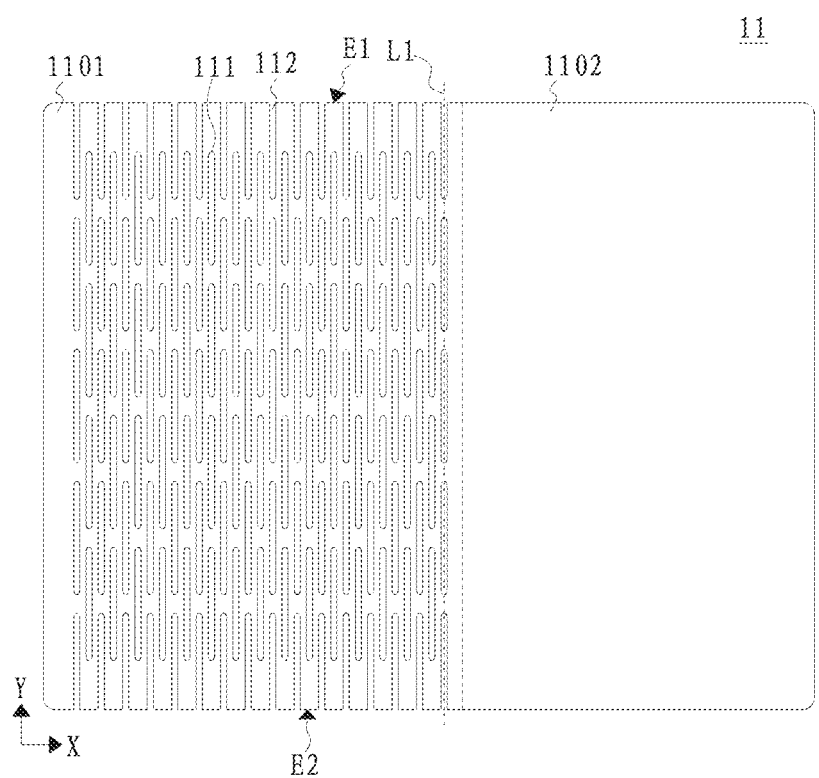
FIG. 3 is a plan schematic diagram of a first support plate according to an embodiment of the present disclosure.
Figure 4:
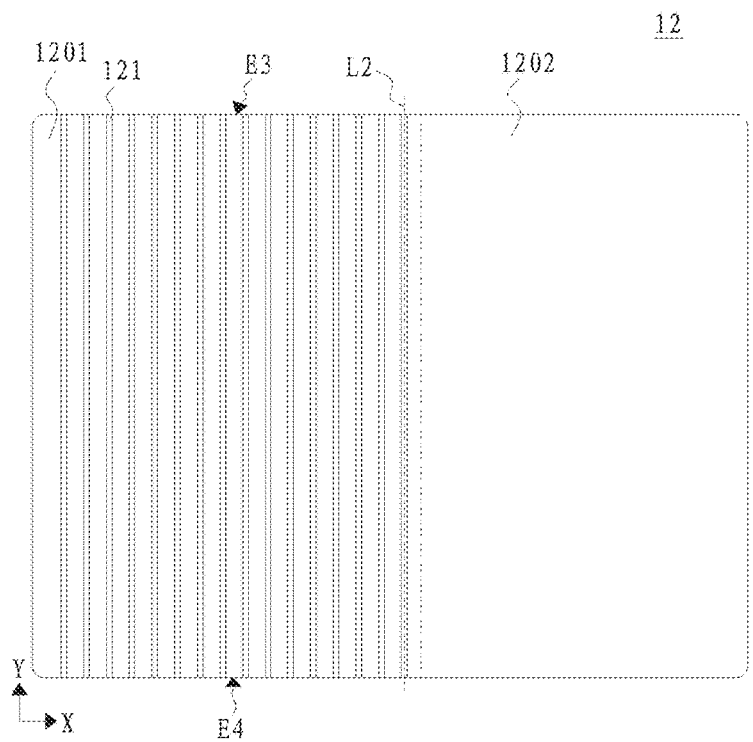
FIG. 4 is a plan schematic diagram of a second support plate according to an embodiment of the present disclosure.

Please refer to FIG. 3 and FIG. 4. The plurality of first through holes 111 are disposed along a first direction X and a second direction Y intersecting the first direction X, and the plurality of blind holes 121 are disposed along the first direction X. A plane of the first direction X and the second direction Y is parallel to a surface of the support element 10, and the second direction Y is parallel to the reel or the bending axis. When the flexible display module 100 has a curling function, the flexible display module 100 is curled or unfolded along the reel. When the flexible display module 100 has a bending function, the flexible display module 100 is bent or unfolded along the bending axis. The glue layer 13 is preferably a flexible glue layer 13, including but not limited to OCA glue.

The first support plate 11 and the second support plate 12 can be, but not limited to, a steel use stainless (SUS) material.

The through hole in an embodiment of the present disclosure refers to a hole that penetrates a thickness of a film layer where it is disposed, and the blind hole refers to a hole that does not completely penetrate the thickness of the film layer where it is disposed.

Please refer to FIG. 1, FIG. 3 to FIG. 5. The embodiment of the present disclosure is described by taking the flexible display module 100 including the flexible area FA with the winding performance and the inflexible area NFA disposed on one side of the flexible area FA as an example. A part of the flexible display module 100 disposed in the flexible area FA can be rolled or flattened around the reel to change a size of a display surface of the flexible display module 100.

The support element 10 includes a curled area 101 and a non-curled area 102 disposed on one side of the curled area 101. The curled area 101 corresponds to the flexible area FA, and the non-curled area 102 corresponds to the inflexible area NFA. The curled area 101 is configured to curl or flatten around the reel. A following description of the structure of the support element 10 is also applicable to the flexible display module that is bent or unfolded along the bending axis.

The first support plate 11 includes a first flexible part 1101 and a first straight part 1102, and the second support plate 12 includes a second flexible part 1201 and a second straight part 1202. The first flexible part 1101 and the second flexible part 1201 are correspondingly disposed in the curled area 101, and the first straight part 1102 and the second straight part 1202 are correspondingly disposed in the non-curled area 102. Wherein, the first through hole 111 is disposed at the first flexible part 1101 of the first support plate 11 corresponding to the curled area 101, and the blind hole 121 is disposed at the second flexible part 1201 of the second support plate 12 corresponding to the curled area 101, so that the support element 10 can be configured to support a rollable flexible display panel, and a supporting strength of the flexible display panel can also be improved when ensuring the bending and curling performance of the curled area 101.

Specifically, please refer to FIG. 3 and FIG. 4. The plurality of first through holes 111 are disposed along the first direction X and the second direction Y intersecting the first direction X, and the plurality of blind holes 121 are disposed along the first direction X. The plane of the first direction X and the second direction Y is parallel to the surface of the support element 10, and the second direction Y is parallel to the reel.

In order to make a stress distribution of the support element 10 of an embodiment of the present disclosure uniform during a bending and crimping process, preferably, the plurality of the blind holes 121 are disposed at equal intervals along the first direction X, and the plurality of the first through holes 111 are disposed at equal intervals along the first direction X, and are disposed at equal intervals along the second direction Y.

Figure 6:
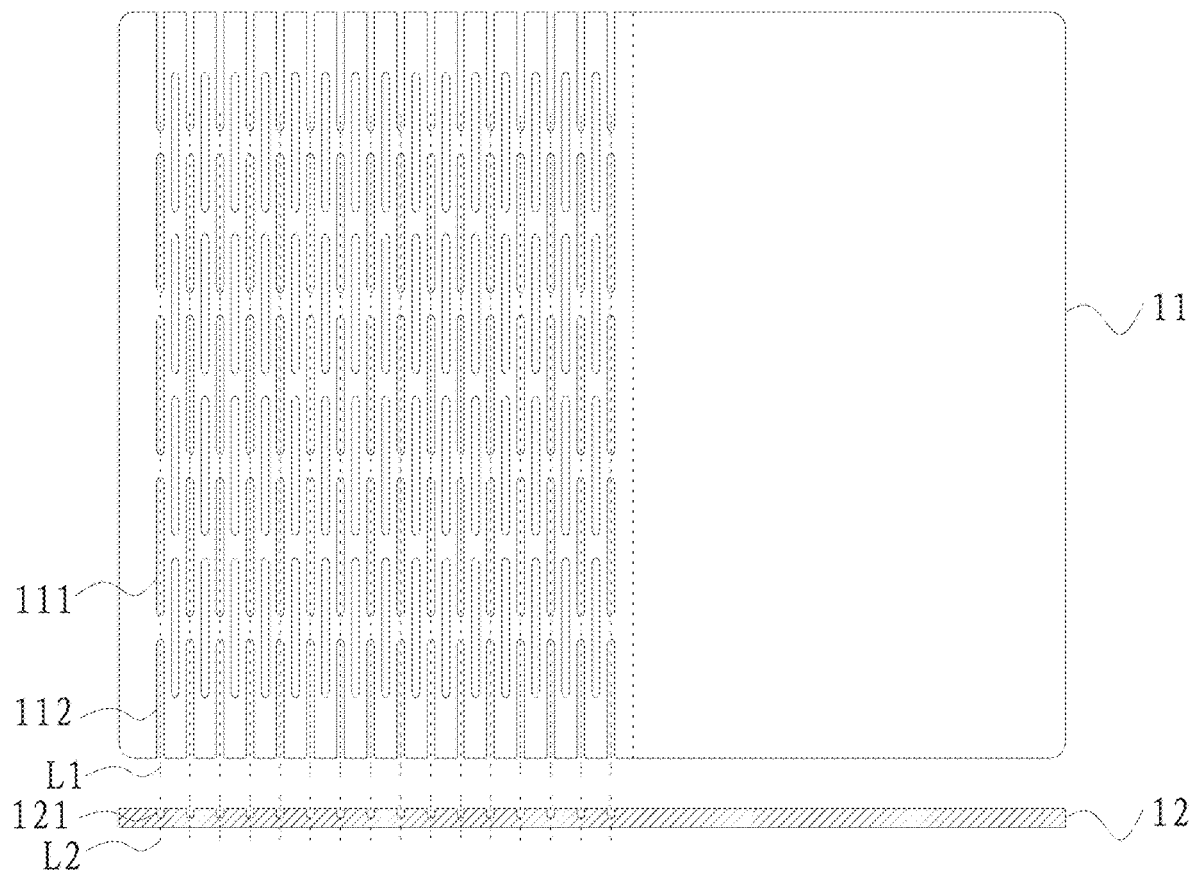
FIG. 6 is a structure schematic diagram of the first support plate and the second support plate according to an embodiment of the present disclosure.

Please refer to FIG. 6. In order to ensure that an overall supporting ability of the support element 10 is optimal, a center line L2 of any column of the blind holes 121 along the second direction Y is aligned with a center line L1 of one of columns of the first through holes 111 along the second direction Yin a thickness direction of the glue layer 13. By aligning the center line L1 of the first through hole 111 on the first support plate 11 with the center line L2 of the blind hole 121 on the second support plate 12, a risk of stress concentration caused by a mismatch of a movement of each substructure due to bending during a bending process of the upper and the lower support plates is reduced. Wherein, the second direction Y is taken as a column direction.

Further, referring to FIG. 6, a distance between the center lines L2 of two adjacent columns of the blind holes 121 along the second direction Y is twice a distance between the center lines L1 of two adjacent columns of the first through holes 111 along the second direction Y. In short, on a basis that the center line L1 and the center line L2 overlap, the blind holes 121 are disposed at intervals of a column of the first through holes 111. By reasonably designing a distance between adjacent blind holes 121, the bending and curling performance of the support element 10 can also be ensured while rigidity of the support element is ensured.

In some embodiments of the present disclosure, referring to FIG. 3, the first support plate 11 includes a first edge E1 and a second edge E2 that are perpendicular to the second direction Y and opposite to each other, and the first flexible part 1101 includes a plurality of second through holes 112 disposed along the first edge E1 and the second edge E2, and any one of the second through holes 112 intersects its corresponding edge. By disposing a column of the second through holes 112 on the two edges of the first support plate 11 respectively, a ductility of the first support plate 11 can be improved during bending, and the bending stress can be released.

In an embodiment of the present disclosure, a shape of the second through hole 112 is U-shaped.

Preferably, a plurality of through holes disposed along the first edge E1 and the second edge E2 are distributed at equal intervals.

Further, referring to FIG. 3, any one of the second through holes 112 and at least one of the first through holes 111 are in a same column. The center line of the second through hole 112 in the second direction Y coincides with the center line L1 of the first through hole 111, and a width of the second through hole 112 in the first direction X is equal to a width of the first through hole 111.

Preferably, referring to FIG. 3, the plurality of second through holes 112 disposed along the first edge E1 or the second edge E2 are disposed at intervals of each column of the first through holes 111. By disposing the second through holes 112 along the edges at intervals of a column of the first through holes 111, instead of designing a second through hole 112 at a position close to an edge of each column of the first through holes 111, rigidity of the edges of the first support plate 11 can be strengthened, which is conducive to a flatness design of the edges.

In some embodiments, please referring to FIG. 6, the center line L2 of any one of the blind holes 121 along the second direction Y and a center line of at least one second through hole 112 along the second direction Y coincide in the thickness direction of the support element 10. By matching the center lines L2 of the multiple columns of blind holes 121 with the center lines of the second through holes 112 in a one-to-one correspondence, the upper and the lower support plates always maintain a good adaptability during the bending and crimping process, avoiding a stress concentration phenomenon caused by unbalanced forces on upper and lower layers.

Figure 7:
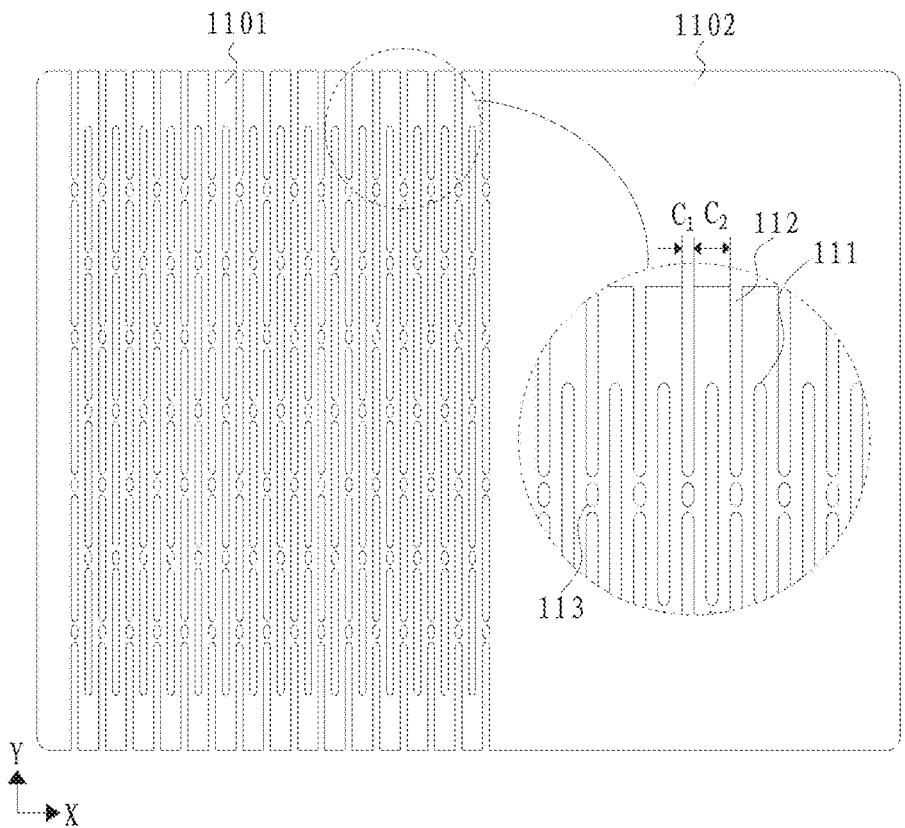
FIG. 7 is a plan schematic diagram of the first support plate according to another embodiment of the present disclosure.
Figure 8:
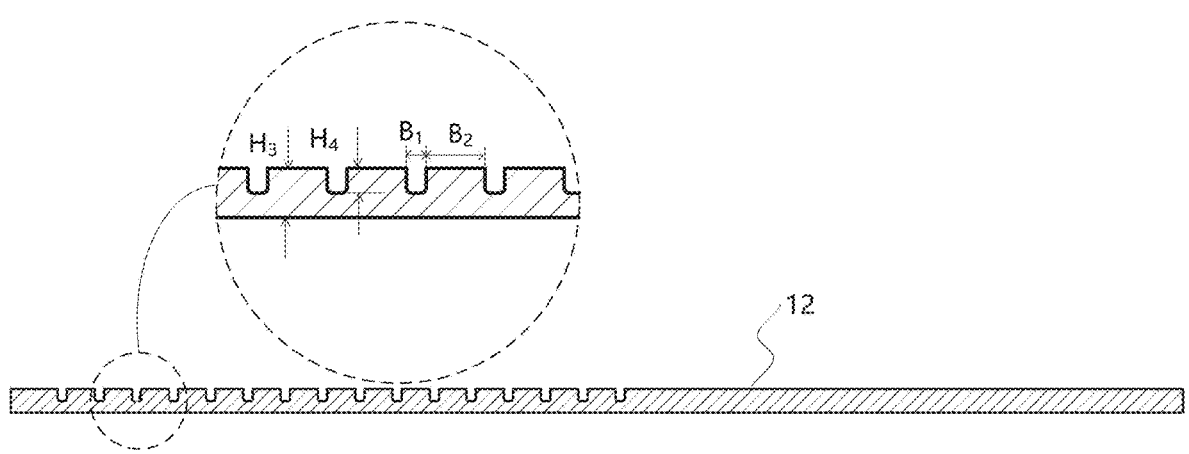
FIG. 8 is a cross-sectional schematic diagram of the second support plate according to an embodiment of the present disclosure.

In some embodiments of the present disclosure, referring to FIG. 7, the first support plate 11 further includes a plurality of third through holes 113 disposed along the first direction X and the second direction Y. The three through holes 113 and the first through holes 111 are alternately disposed in the second direction Y. By further adding the third through hole 113 between adjacent first through holes 111 disposed along the second direction Y, the stress concentration phenomenon between heads of the adjacent first through holes 111 can be reduced.

Preferably, a center line of any column of the third through holes 113 along the second direction Y coincides with the center line L1 of the first through holes 111 in the same column along the second direction Y.

In an embodiment of the present disclosure, a distance between adjacent third through holes 113 and the first through holes 111 in a same column is half of a maximum width of the first through holes 111 in the first direction X. In order to avoid the stress concentration at an end (or a head) of the through hole, the end of the through hole can be designed to be arc-shaped. Therefore, widths and lengths of the through hole at different positions are different. In the first direction X, a width of a middle part of the through hole is greater than a width of an end part. A length of a position of the through hole along the center line in the second direction Y will be greater than a length of positions on both sides of the center line. A maximum width of the through hole in the first direction X mentioned in the embodiment of the present disclosure refers to the width of the middle part of the through hole. A maximum length of the through hole in the second direction Y mentioned below refers to the length of the position of the through hole along the center line of the second direction Y.

Please refer to FIG. 4, in an embodiment of the present disclosure, the second support plate 12 includes a third edge E3 disposed on a same side as the first edge E1, and a fourth edge E4 disposed on a same side as the second edge E2. Any one of the blind holes 121 passes through the third edge E3 and the fourth edge E4 along the second direction Y.

Preferably, the first direction X is perpendicular to the second direction Y. As shown in FIG. 2, the support element 10 includes a symmetry axis L3 parallel to the first direction X. The support element 10 is symmetrical about the symmetry axis L3, so that the curled area 101 of the support element 10 can maintain a uniform stress distribution during bending and crimping.

Please refer to FIG. 7 to FIG. 10. In order to ensure that the center lines L2 of the blind holes 121 corresponds to the center lines L1 of the through holes one-to-one in a flat and a bent state of the upper and the lower support plates to avoid an unbalanced force in the bending process, a design of the support element 10 should satisfy a following relationship:

$$\frac{C_1}{B_1} = \frac{C_2}{B_2} = \frac{R + H_1 + H_2 + 0.5H_3}{R + 0.5H_1}.$$

Wherein, a bending inner radius of the support element 10 is R. A maximum thickness of the first support plate 11 is $H_1$. A thickness of the glue layer 13 is $H_2$. A maximum thickness of the second support plate 12 is $H_3$, and the maximum thickness of the second support plate 12 refers to a thickness of a plate body excluding the blind holes. A width of the blind hole 121 along the first direction X is $B_1$. A distance between two adjacent blind holes 121 disposed along the first direction X is $B_2$. A width of the second through hole along the first direction X is $C_1$. A distance between two adjacent second through holes 112 disposed along the first direction X is $C_2$.

Figure 9:
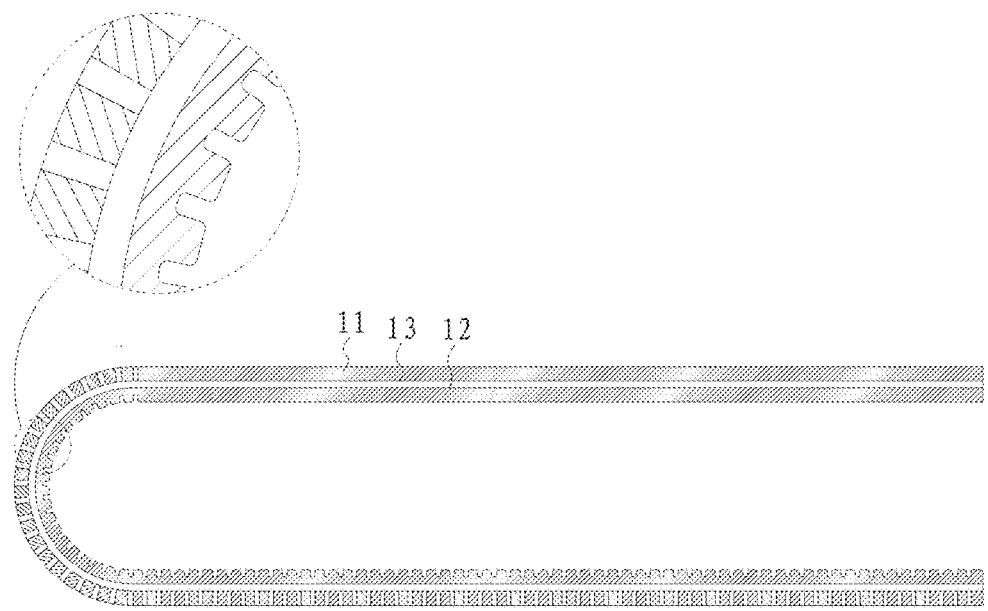
FIG. 9 is a structure schematic diagram of the support element being bent according to an embodiment of the present disclosure.
Figure 10:
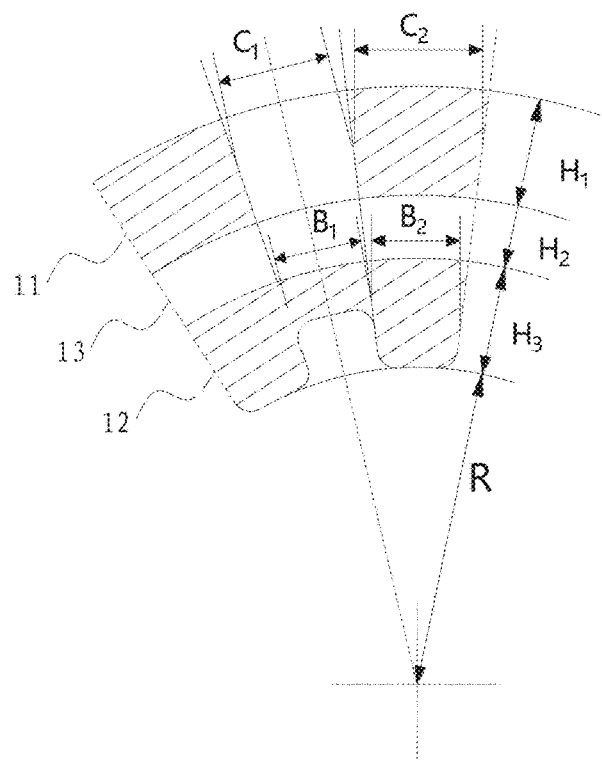
FIG. 10 is a partial schematic diagram of a curled area being bent of the support element according to an embodiment of the present disclosure.

Referring to FIG. 9, when the support element is bent or curled, compared to the first support plate 11, the second support plate 12 is closer to a center of a circle when the support element is bent. That is, the bending inner radius R of the support element 10 refers to a distance between the center of the circle and the second support plate 12 during bending.

In an actual design process, values of R, $H_1$, $H_2$, and $H_3$ can be determined according to actual design values. $C_1$ and $C_2$ can be determined according to a hole width and a hole distance of the first through holes 111 disposed on the first support plate 11. Under this condition, $B_1$ and $B_2$ can be determined according to an above formula and a size of the second flexible part 1201 of the second support plate 12.

Figure 5:
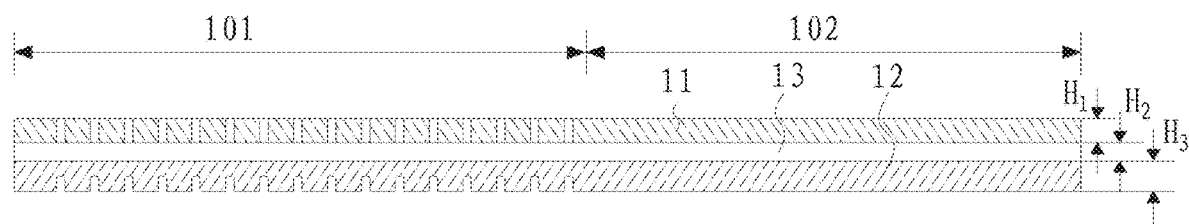
FIG. 5 is a schematic diagram of a film layer stacking structure of the support element according to an embodiment of the present disclosure.
Figure 11:
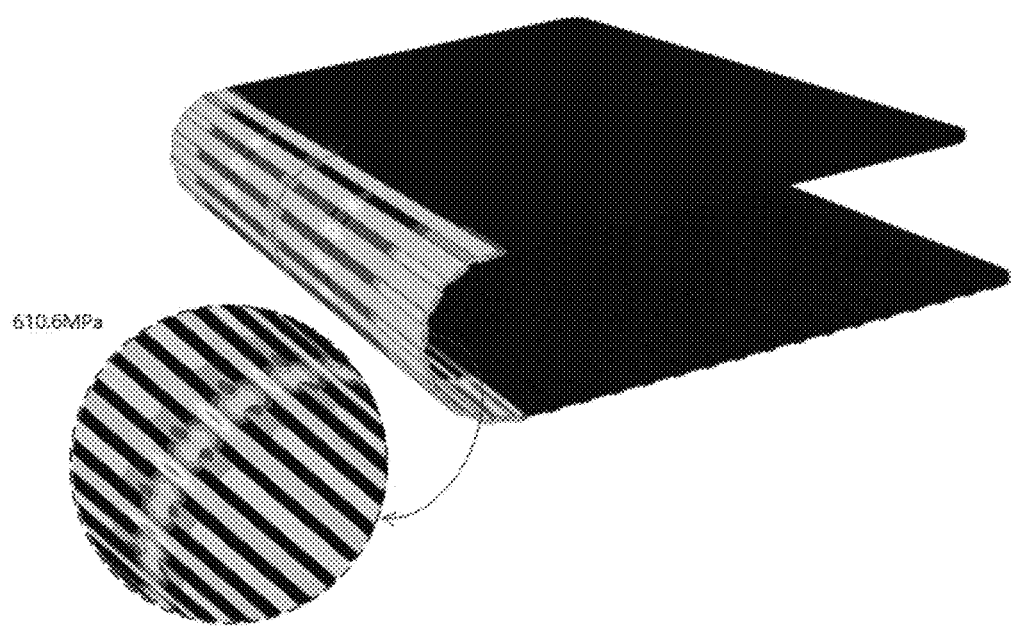
FIG. 11 is a cloud diagram of a bending stress of the support element according
to an embodiment of the present disclosure.

Please refer to FIG. 11, FIG. 5 is a cloud diagram of a bending stress of the support element according to an embodiment of the present disclosure. After determining values of the bending radius R of the support element 10 and $H_1$, $H_2$, $H_3$, $C_1$, $C_2$, $B_1$, and $B_2$, by adjusting a ratio of a hole depth $H_4$ of the blind hole 121 to the maximum thickness $H_3$ of the second support plate, the bending stress of the support element 10 can be reduced to about 610 MPa, which is much lower than a failure strength 1600 MPa of a selected material.

Figure 12:
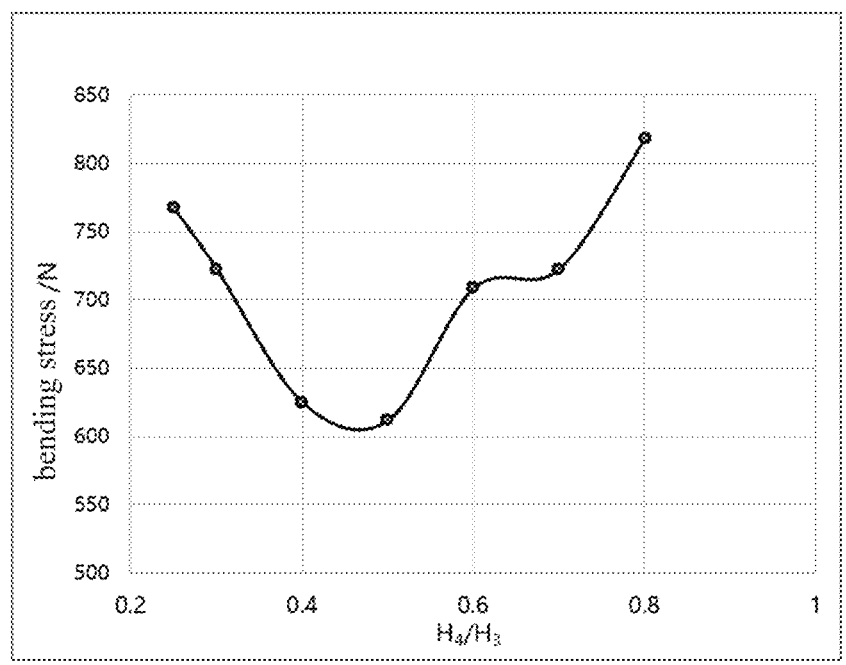
FIG. 12 is a diagram of a relationship between a ratio of a depth of a blind hole to a maximum thickness of the blind hole and the bending stress according to an embodiment of the present disclosure.
Figure 13:
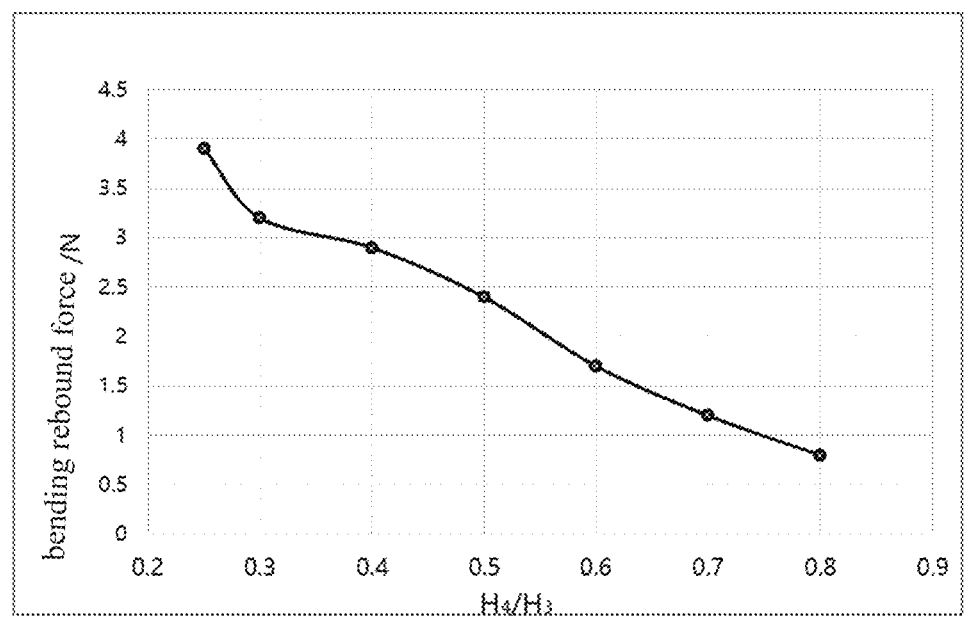
FIG. 13 is a diagram of a relationship between the ratio of the depth of the blind hole to the maximum thickness of the blind hole and a bending rebound force according to an embodiment of the present disclosure.

As shown in FIG. 12 and FIG. 13, FIG. 12 is a diagram of a relationship between a ratio of the depth $H_4$ of the blind hole 121 to the maximum thickness $H_3$ of the blind hole of the second support plate 12 and the bending stress, and FIG. 13 is a diagram of a relationship between the ratio of the depth $H_4$ of the blind hole to the maximum thickness $H_3$ of the blind hole of the second support plate 12 and a bending rebound force. Specifically, under a premise of determining a structural size of the first support plate 11, a better bending rebound supportability and a bending performance can be obtained by adjusting the ratio. Combining the above formula, value ranges of structural characteristic values of the upper and the lower support plates can be gradually obtained, so as to obtain an optimal bending performance.

It can be seen from FIG. 12 and FIG. 13 that a preferred value range of the ratio of $H_4$ to $H_3$ in an embodiment of the present disclosure is 0.4 to 0.5. Within this value range, the bending stress reaches an optimal value range. Please refer to FIG. 7, the first through hole 111 an embodiment of the present disclosure. Compared with an aligned design, the first through holes 111 disposed in a staggered arrangement can avoid a local stress concentration, which is beneficial to bending and curling of the curled area 101.

Further, the first through hole 111, the second through hole 112, and the third through hole 113 all extend along the second direction Y. That is, the maximum length of the through hole mentioned in the embodiment in the second direction Y is greater than the maximum width of the through hole in the first direction X. That an extension direction of each through hole is disposed to be parallel to a direction of the reel is beneficial to improve an extensibility of the first support plate 11. More specifically, the ratio of the maximum length of the first through hole 111 in the second direction Y to the maximum width of the first through hole 111 in the first direction X ranges from 40 to 60.

A distance between the first through holes 111 in two adjacent columns is equal to the maximum width of the first through holes 111 in the first direction X.

The maximum length of the first through hole 111 along the second direction Y, a maximum length of the second through hole 112 along the second direction Y, and a maximum length of the third through hole 113 along the second direction Y decrease sequentially.

A distance between adjacent first through hole 111 and the third through hole 113 in a same column depends on a hole length and a hole width of the first through holes 111, and a distance between two adjacent first through holes 111 in the same column in the actual design. In an embodiment of the present disclosure, the distance between the adjacent first through hole 111 and the third through hole 113 in a same column is equal to half of the maximum width of the first through holes 111 in the first direction X.

In an embodiment of the present disclosure, widths of the first through hole 111, the second through hole 112, and the third through hole 113 in the first direction X are the same.

In an embodiment of the present disclosure, the first through hole 111 and the second through hole 112 can be, but not limited to, elongated shapes. In order to avoid the stress concentration at corners of the elongated shape, ends of the first through hole 111 and the second through hole 112 can be designed to be an arc shape, including but not limited to semi-elliptical, semi-circular, and the like.

Specifically, in an embodiment of the present disclosure, for the first through hole 111, the maximum length along the second direction Y ranges from 4.5 to 6 mm, and the maximum width along the first direction X ranges from 0.2 to 0.25 mm. The distance between the first through holes 111 in two adjacent columns ranges from 0.18 to 0.22 mm. A geometric characteristic value of each through hole of the first support plate 11 can be adjusted correspondingly according to a specific size of a screen module, a thickness of a stacking structure, and a composition of the module.

In an above design scheme, under a condition that the bending radius value R of the display module is determined, characteristic values of each substructure of the support plate, a thickness of the plate, the thickness of the glue layer 13, and a size relationship between $B_1$, $B_2$, $C_1$, and $C_2$ is combined to ensure that the upper and the lower support plate can ensure a one-to-one relationship between centers of each substructure in both the flat and the bent states, and then the ratio of $H_4$ to $H_3$ is adjusted to obtain the optimal bending performance of the support element 10 and reduce a failure risk of the module.

Please refer to FIG. 1, the flexible display panel 40 is disposed on a side close to the first support plate 11 of the support element 10. Since the support element 10 needs to be glued to the module when attached to the module, glue can not only be confined to deform inside the through hole of the first support plate 11 during the bending process, but also can be blocked by the second support plate 12. If the flexible display panel 40 is disposed on a side close to the second support plate 12, on one hand, the glue layer 13 overflows from a hole during the bending process, and on another hand, a bending radius of the second support plate 12 is reduced due to a change of a bending position in the bending process. Therefore, the stress increases correspondingly, and a fracture failure occurs.

In an embodiment of the present disclosure, the flexible display panel 40 can be an OLED display panel, which can be deformed under the action of the external force.

Specifically, the flexible display module 100 further includes a backplane 30, a polarizer 50, and a cover plate 70.

The backplane 30 is disposed between the flexible display panel 40 and the support element 10. The polarizer 50 is disposed on a side of the flexible display panel 40 away from the support element 10. The cover plate 70 is disposed on a side of the polarizer 50 away from the flexible display panel 40.

A foam layer 20 can be disposed between the back plate 30 and the support element 10 to play a role of buffering stress. An ultra-thin glass (UTG) 60 can also be disposed between the polarizer 50 and the cover plate 70 to improve creases. Since various components of the flexible display module 100 need to be bonded together, above-mentioned components can be bonded through a glue layer such as OCA.

The flexible display module 100 in the above embodiment can be applied to a folding display device, and the folding display device can be a folding mobile phone with a medium or small size. The flexible display module 100 is configured to realize a display effect of a reel screen being collected and unfolded, and at the same time, to maximize the flatness of an unfolded screen and reduce a risk of separation of an internal film layer. The folding display device can also be a large-size folding computer of 14 inches or more, which is configured to realize folding or unfolding a large-size folding screen along the bending axis. Due to a large bending radius of the large-size folding screen, the support element with an above structure can improve a crease phenomenon of the large-size folding screen and reduce the risk of separation of the internal film layers.

It can be understood that, for those of ordinary skill in the art, equivalent replacements or changes can be made according to the technical solution of the present disclosure and its inventive concept, and all these changes or replacements shall fall within the protection scope of the appended claims of the present disclosure.

What is claimed is:

1. A flexible display module, comprising a flexible area, and the flexible display module comprises a flexible display panel and a support element for supporting the flexible display panel, wherein the support element comprises:
   a glue layer; and
   a first support plate and a second support plate respectively disposed on two opposite sides of the glue layer;
   wherein the first support plate comprises a first flexible part disposed in the flexible area, and the first flexible part comprises a plurality of first through holes; and
   wherein the second support plate comprises a plurality of second flexible parts disposed in the flexible area, and a side of each of the plurality of second flexible parts away from the first support plate comprises a plurality of blind holes;
   wherein, the plurality of first through holes are disposed along a first direction and a second direction intersecting the first direction, and the plurality of blind holes are disposed along the first direction, and a plane on which the first direction and the second direction are disposed is parallel to a surface of the support element, and the second direction is parallel to a reel or a bending axis;
   wherein the second direction is a column direction; and
   a distance between center lines of two adjacent columns of the plurality of blind holes along the second direction is twice a distance between center lines of two adjacent columns of the plurality of first through holes along the second direction.

2. The flexible display module as claimed in claim 1, wherein, a center line of any column of the plurality of blind holes along the second direction is aligned with a center line of one of columns of the plurality of first through holes along the second direction in a thickness direction of the glue layer.

3. The flexible display module as claimed in claim 1, wherein, the first support plate comprises a first edge and a second edge perpendicular to the second direction and opposite to each other, and the first flexible part comprises a plurality of second holes disposed along the first edge and the second edge, and any one of the plurality of second through holes intersects a corresponding edge.

4. The flexible display module as claimed in claim 3, wherein, any one of the plurality of second through holes is in a same column as at least one of the plurality of first through holes, and the plurality of second through holes disposed along the first edge or the second edge are disposed at intervals of one column of the plurality of first through holes.

5. The flexible display module as claimed in claim 4, wherein, a center line of any one of the plurality of blind holes along the second direction and a center line of at least one of the plurality of second through holes along the second direction coincide in a thickness direction of the glue layer.

6. The flexible display module as claimed in claim 5, wherein, a bending inner radius of the support element is R, and a maximum thickness of the first support plate is $H_1$, and a thickness of the glue layer is $H_2$, and a maximum thickness of the second support is $H_3$, and a width of each of the plurality of blind holes along the first direction is $B_1$, and a distance between two adjacent ones of the plurality of blind holes disposed along the first direction is $B_2$, and a width of each of the plurality of second through holes along the first direction is $C_1$, and a distance between two adjacent ones of the plurality of second through holes disposed along the first edge or the second edge is $C_2$, wherein the support element satisfies a following relationship:

$$\frac{C_1}{B_1} = \frac{C_2}{B_2} = \frac{R + H_1 + H_2 + 0.5H_3}{R + 0.5H_1}.$$

7. The flexible display module as claimed in claim 5, wherein, a maximum thickness of the second support plate is $H_3$, and a depth of each of the plurality of the blind hole is $H_4$, and a value range of a ratio of the $H_4$ to the $H_3$ is between 0.4 and 0.5.

8. The flexible display module as claimed in claim 3, wherein, the second support plate comprises a third edge disposed on a same side as the first edge, and a fourth edge disposed on a same side as the second edge, and any one of the plurality of blind holes penetrates the third edge and the fourth edge along the second direction.

9. The flexible display module as claimed in claim 3, wherein, a shape of each of the plurality of second through holes is U-shaped.

10. The flexible display module as claimed in claim 1, wherein, the first direction is perpendicular to the second direction, and the support element comprises a symmetry axis parallel to the first direction, and the support element is symmetrical about the symmetry axis.

11. The flexible display module as claimed in claim 1, wherein, the first support plate further comprises a plurality of third through holes disposed along the first direction and the second direction, and the plurality of third through holes and the plurality of first through holes are alternately disposed in the second direction.

12. The flexible display module as claimed in claim 11, wherein, a center line of any column of the plurality of third through holes along the second direction coincides in a center line of first through holes of the plurality of first through holes in a same column.

13. The flexible display module as claimed in claim 12, wherein, a distance between adjacent third through hole and first through hole in a same column is half of a maximum width of each of the plurality of first though holes along the first direction.

14. The flexible display module as claimed in claim 1, wherein, two adjacent columns of the plurality of first through holes are disposed in a staggered manner.

15. The flexible display module as claimed in claim 1, wherein, the second direction is a column direction, and a distance between two adjacent columns of the plurality of first through holes is equal to a maximum width of each of the plurality of first though holes along the first direction.

16. The flexible display module as claimed in claim 1, wherein, a ratio of a maximum length of each of the plurality of the first through holes in the second direction and a maximum width of each of the plurality of first through holes in the first direction ranges from 40 to 60.

17. The flexible display module as claimed in claim 1, wherein, the flexible display module further comprises:
    a backplane disposed between the flexible display panel and the support element;
    a polarizer disposed on a side of the flexible display panel away from the support element; and
    a cover plate disposed on a side of the polarizer away from the flexible display panel.

18. The flexible display module as claimed in claim 1, wherein, the flexible display panel is disposed on a side close to the first support plate of the support element.

\* \* \* \* \*